(12) United States Patent  
Bertrand et al.

(10) Patent No.: US 6,340,395 B1  
(45) Date of Patent: Jan. 22, 2002

(54) SALSA CLEAN PROCESS

(75) Inventors: Jacques Bertrand, Capitola, CA (US); Barry Dick, Austin, TX (US); Shu Tsai Wang, San Jose, CA (US); Weiwen Ou, Berkeley, CA (US); Lynne A. Okada, Sunnyvale, CA (US); Yen C. Chu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/526,753

(22) Filed: Mar. 16, 2000

Related U.S. Application Data

(60) Provisional application No. 60/176,527, filed on Jan. 18, 2000.

(51) Int. Cl.$^7$ .................................................. C23G 1/02

(52) U.S. Cl. ............................ 134/2; 134/3; 134/22.17; 134/23; 134/25.1; 134/25.4; 134/25.5; 134/26; 134/28; 134/29; 134/32; 134/33; 134/34; 134/36; 134/902; 216/108; 438/906; 510/175; 510/176; 510/367; 510/372; 510/435; 252/186.28

(58) Field of Search .............................. 134/2, 3, 22.17, 134/23, 25.1, 25.4, 25.5, 26, 28, 29, 32, 33, 34, 36, 902; 216/108; 438/906; 510/175, 176, 435, 367, 372; 252/186.28

(56) References Cited

U.S. PATENT DOCUMENTS

| | | | | |
|---|---|---|---|---|
| 3,900,337 A | * | 8/1975 | Beck et al. | 134/3 |
| 3,990,462 A | * | 11/1976 | Elftmann et al. | 134/102 |
| 4,609,575 A | * | 9/1986 | Burkman | 427/426 |
| 4,682,615 A | * | 7/1987 | Burkman et al. | 134/102 |
| 5,637,151 A | * | 6/1997 | Schulz | 134/2 |
| 5,679,171 A | * | 10/1997 | Sage et al. | 134/29 |
| 5,853,491 A | * | 12/1998 | Schulz | 134/2 |
| 5,861,064 A | * | 1/1999 | Oikari et al. | 134/26 |
| 5,896,875 A | * | 4/1999 | Yoneda | 134/102.3 |

FOREIGN PATENT DOCUMENTS

JP 04142741 * 5/1992

* cited by examiner

*Primary Examiner*—Sharidan Carrillo  
(74) *Attorney, Agent, or Firm*—Deborah Wenocur; Gerald Fisher

(57) ABSTRACT

A wet spray cleaning process for removing thick organic layers including hardened photoresist from the surface of silicon wafers yields low residual particle counts for photoresist thicknesses up to 3 microns, and maintains low residual particle density for oxide-covered wafer regions. The cleaning process uses multiple cycles of SPM/DI/APM/DI, without an intervening drying step therebetween.

6 Claims, 3 Drawing Sheets

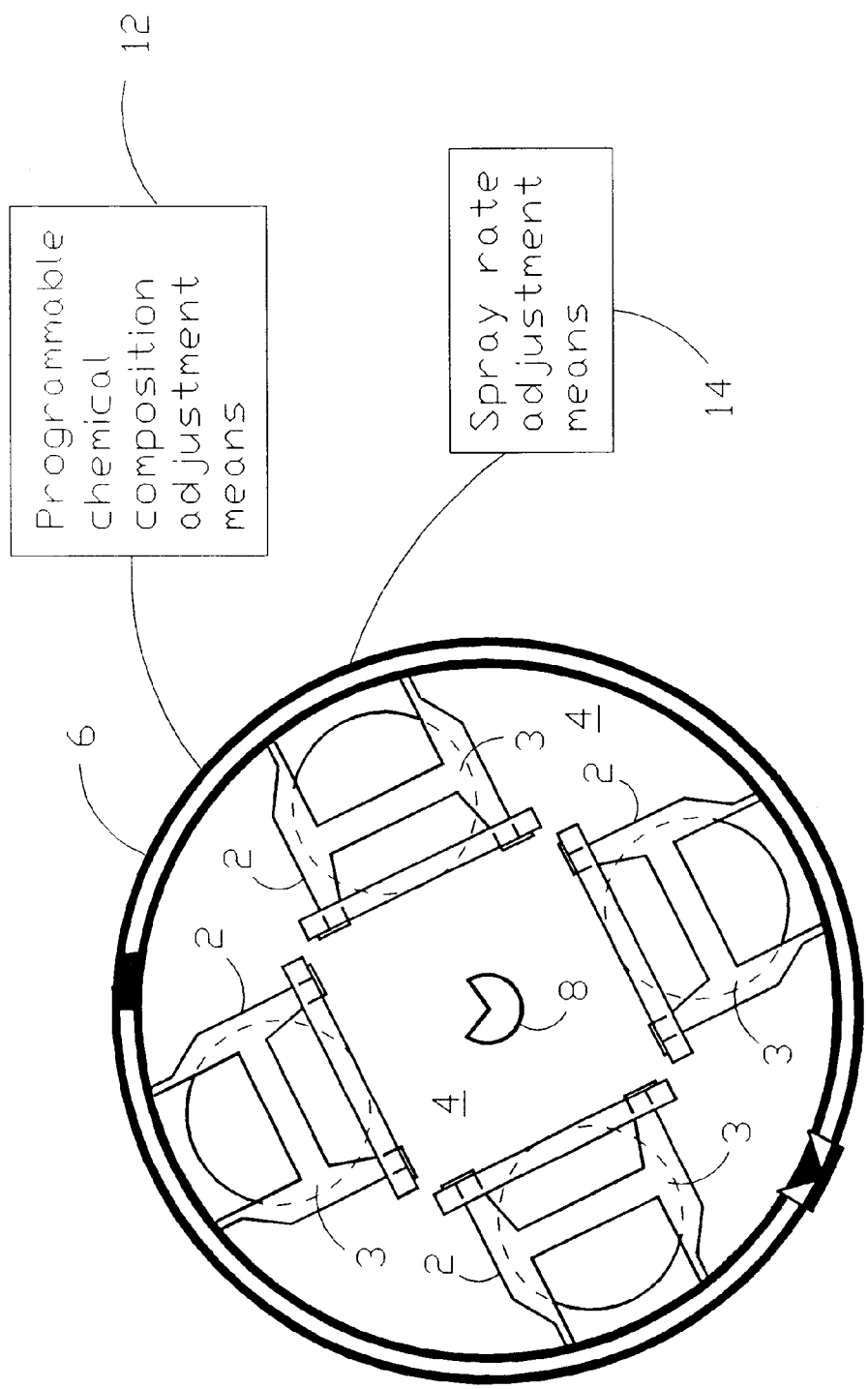

SALSA CLEAN PROCESS

This application claims the benefit of U.S. Provisional Application No. 60/176,527 filed on Jan. 18, 2000.

FIELD OF THE INVENTION

This invention relates to integrated circuit manufacturing processes, and in particular to cleaning processes for photoresist coated silicon wafers.

BACKGROUND OF THE INVENTION

During the integrated circuit manufacturing process, lithography is employed repeatedly to form imaging masks on the surface of the wafer, from organic materials called photoresists (PR). Surface cleaning of the semiconductor wafer is required at different points in the process in order to remove or strip organic materials such as the photoresist from the surface, or in order to remove particulate contaminants which are on the surface. Various wet processes for such cleaning have been known in the art. Wet processes are generally simpler and more cost and time effective than dry plasma cleaning and stripping methods. A description of wafer cleaning procedures is found in *Silicon Processing for the VLSI Era*, S. Wolf and R. Tauber, Lattice Press, 1986, pp 516–520.

One of the best known of such wet cleaning methods is called the RCA clean. The RCA cleaning method is generally used just prior to a diffusion step to remove surface contaminants, where the wafers are in a nearly clean state, and any photoresist on the wafer had been previously stripped. This cleaning method comprises the steps of:

a) immersing the wafers in a sulfuric acid/hydrogen peroxide mixture (hereinafter referred to as Sulfuric Peroxide Mixture, or SPM), b) rinsing in De-Ionized (DI) water, c) then immersing the wafers in an ammonium hydroxide/hydrogen peroxide mixture (hereinafter referred to as Ammonium Peroxide Mixture, or APM) to remove residual organic contaminants, d) DI water rinse, e) immersing the wafers in hydrofluoric acid/water to remove the hydrous oxide film formed by the APM step, f) immersing the wafers in hydrochloric acid/hydrogen peroxide/water to remove metallic or other contaminants, g) DI water rinse, h) nitrogen dry.

Removing or stripping thick organic layers, particularly photoresist which has been hardened or polymerized, is a difficult task. Some previous methods for stripping PR use acids to chemically degrade the organic material. Immersion of wafers in SPM to strip photoresist layers is described in U.S. Pat. No. 3,900,337 by Beck et al. Use of spray processor equipment to provide multiple cycles of SPM exposure and DI water rinse is described in U.S. Pat. No. 5,861,064 by Oikari et al. The use of spray processors is advantageous over immersion of wafers into cleaning baths, due to lowered contamination of the cleaning fluid.

None of the aforementioned cleaning methods has been consistently effective under a variety of conditions in removing thick photoresist layers (1.8 to 3.0 microns thick, e.g. for implant layer masking), because of high residual contaminant particle count.

SUMMARY OF THE INVENTION

It is therefore an object of this invention to provide an improved integrated circuit manufacturing wet method for removing organic layers from the surface of semiconductor wafers.

It is a further object of this invention to provide an integrated circuit manufacturing wet method for removing organic layers from the surface of semiconductor wafers that leaves a low residual contaminant particle count and contributes to reduced defect densities.

It is a further object of this invention to provide an integrated circuit manufacturing wet method for removing organic layers from the surface of semiconductor wafers that leaves a low residual contaminant particle count for organic layer thicknesses up to 3.0 microns and higher.

It is a further object of this invention to provide an integrated circuit manufacturing wet method for removing organic layers from the surface of semiconductor wafers that utilizes spray processing apparatus and methods.

It is a further object of this invention to provide an integrated circuit manufacturing wet method for removing photoresist organic layers from the surface of semiconductor wafers that simultaneously strips thick hardened photoresist layers, and additionally provides low residual contaminant particle count on those portions of the wafer having photoresist thereon, and those having no photoresist thereon.

These objects are met by utilizing a novel cleaning sequence hereinafter known as SALSA which utilizes multiple cycles of SPM and APM treatments without drying between cycles, thereby preventing the redeposition of material removed during previous cycles and resulting in significantly reduced defect densities.

BRIEF DESCRIPTION OF THE DRAWINGS

FIG. 1a is a top view of the FSI Mercury spray processor used in the experiments described herein.

DETAILED DESCRIPTION OF THE INVENTION

Our inventive cleaning process for stripping thick photoresist layers comprises a novel recipe known as SALSA. The recipe includes a unique chemical sequence including: prerinse, SPM, rinse, APM, rinse, SPM, rinse, APM, rinse, and final dry. Each step immediately follows the preceding step with no planned or significant time delay between steps. There is no drying step between the SPM and APM cycles. This inventive sequence has been found to reduce residual particle counts and in particular to lower the count of particles with diameters of 0.3 microns and greater.

Figure 1B:
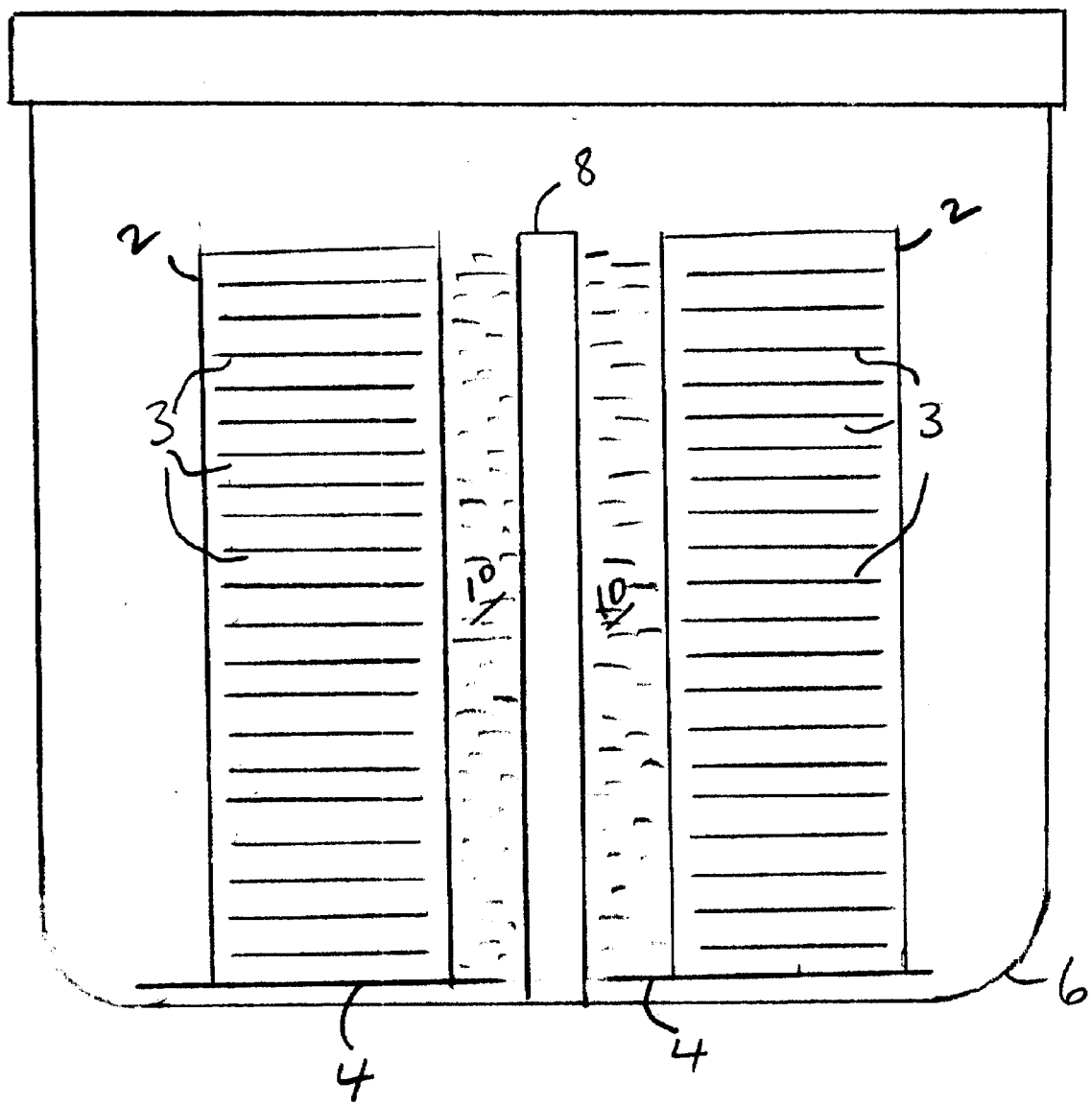
FIG. 1b is a side view of the FSI Mercury spray processor used in the experiments described herein.

FIG. 1a shows a top view of the FSI Mercury spray processor wet sink, manufactured by FSI International, Chaska, Minn. This is the spray processor in which the inventive process was developed and tested. The inventive process sequence may be implemented using other spray processors made by other manufacturers. Four wafer cassettes 2, each of which holds up to twenty-five horizontally stacked wafers 3 are loaded onto a turntable 4 in processor bowl 6, evenly spaced about vertical center spray post 8. Turntable 4 rotates cassettes 2 around spray post 8. FIG. 1b shows a side view of spray post 8 for evenly dispersing chemical spray 10 across wafers 3. DI rinse and nitrogen for drying are also dispersed from spray post 8. Plumbing, control, and drain systems are provided so that the spray solutions can be programmably varied and adjusted by programmable chemical composition adjustment means 2, and cassette rotation rates may be adjusted. Spray rate adjustment means 14 are also provided.

The inventive process has been developed on 8-inch silicon wafers having 1.2–1.8 micron thick photoresist layers thereon, and on 8-inch wafers having 0.1 microns oxide thereon, with no photoresist. The residual particle counts have been measured using an INSPEX detection system, which has a lower detection limit of 0.18 microns. The target value for contaminant levels after photoresist stripping is less than 20 INSPEX counts across the wafer.

The first chemical step in the inventive process following pre-rinse is the SPM clean. The mixture of sulfuric acid and hydrogen peroxide used to yield the results described herein was a volume ratio of 2:1 sulfuric/$H_2O_2$, but it is believed that sulfuric acid/hydrogen peroxide ratios between 1:1 and 4:1, depending on the exact application, will give acceptable results. The SPM is sprayed at approximately one liter/minute for five minutes or more, followed by a DI rinse for 3 to 5 minutes or more. The flow level and time may be optimized for the particular application, with expected acceptable ranges of 1–3 liters/minute SPM flow rate, and 5–15 minutes SPM spray time. This sequence of SPM/DI may be repeated one or more times. The SPM step oxidizes the organic materials, thereby removing the photoresist, but additionally leaves a thin oxide layer along with any remaining unreacted organic particulates. In the inventive process, the target of the first SPM step is to remove approximately 90% of the photoresist.

The second chemical step in the inventive process is the APM clean. The mixture of ammonium hydroxide and hydrogen peroxide used to yield the results described herein was a volume ratio of 5:1:1 DI/Ammonium Hydroxide/Hydrogen Peroxide, but it is believed that a range of ammonium hydroxide/hydrogen peroxide ratios between 0.25 and 4, depending on the exact application, will give acceptable results. Higher percentages of DI water, up to 20 parts, are also expected to give acceptable results. The APM is sprayed at 1.7 liters/minute, with an expected acceptable range of 1–3 liters/minute, for 3 minutes, with an expected acceptable range of 1 to 10 minutes, followed by a DI rinse for 3 to 10 minutes. The flow level and time may be optimized for the particular application. The goal of the APM is to remove approximately 3–4 Angstroms of oxide, thereby undercutting and removing remaining small particulates, as well as loosening larger particles.

Figure 2:
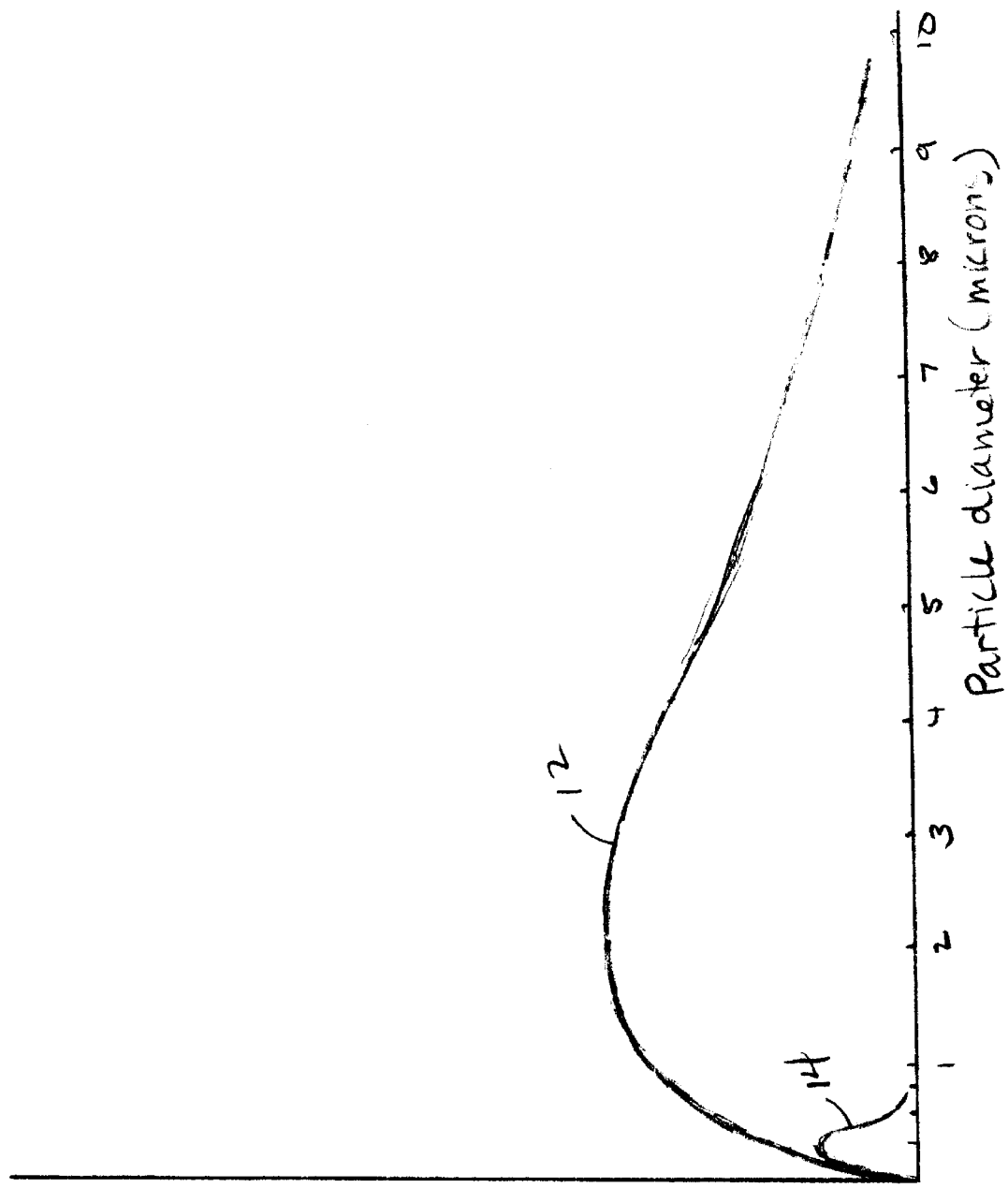
FIG. 2 is an approximate representation of the size distributions of remaining particles for a single SPM/DI/APM/DI cycle compared with our two cycle SALSA clean.

The SPM/DI/APM/DI cycle is repeated at least one more time without performing a nitrogen drying step therebetween. It is believed that eliminating the drying step between cycles prevents both the hardening and the increased adherence of particles remaining after the first SPM/DI/APM/DI cycle. This enables the second SPM/DI/APM/DI cycle to more effectively remove the remaining photoresist and particulates, making a very low defect density possible. Furthermore, it is believed that repeating the SPM/DI/APM/DI cycle without performing a nitrogen drying step therebetween modifies the size distribution of the remaining particulates, as is illustrated in FIG. 2. Distribution 12, as is believed to occur after a single SPM/DI/APM/DI cycle, shows a large tail of particle diameters up to approximately 10 microns. Distribution 14, as is believed to occur after a two-cycle SALSA clean, shows the particle diameter strongly peaked at approximately between 0.18 and 0.3 microns, with very little tailing to larger diameters.

TABLE 1

Residual across-the wafer particle counts for SALSA clean compared with prior art clean

|  | 1.2 micron PR | 1.8 micron PR | 0.1 micron oxide |
| --- | --- | --- | --- |
| SALSA | 10–20 | 10–20 | <20 |
| Prior art |  | 400 | 80 |

Table 1 shows typical total across-the-wafer residual particle counts for 1.2 micron and 1.8 micron photoresist on 8-inch silicon wafers, and for 0.1 micron oxide on 8-inch silicon wafers, using the inventive SALSA clean. It is seen that typical particle counts are less than 20 for the two cycle SALSA clean recipe on wafers having both the 1.2 micron and the 1.8 micron thick photoresist thereon, with no substantial increase in contamination on oxide-covered wafers. This data indicates that the SALSA clean can be used to effectively strip photoresist without introducing additional contamination to the non-photoresist covered regions, thus enabling its use at process steps such as via clean. Yield data on production wafers indicates that the inventive process works well for photoresist thicknesses up to 3.0 microns, and also for hardened photoresist layers.

Table 1 additionally shows that the SALSA clean recipe gives substantially lower residual particle counts than have been seen for identical wafers cleaned using prior art methods. A prior art multiple cycle SPM/DI clean was performed on 8-inch wafers having 1.8 microns photoresist thereon. This clean comprised 6 cycles consisting of: 2:1 sulfuric acid/hydrogen peroxide sprayed for 2 minutes 20 seconds at 660 ml/min, followed by 4 minutes DI rinse. Typical residual particle counts using the aforementioned prior art cleaning process were >400.

By using our inventive SALSA cleaning recipe, we have been able to achieve improved residual particle counts after removal of such difficult-to-remove organic materials as thick layers of hardened or polymerized photoresist. During the SPM/APM/SPM/APM sequencing in the SALSA recipe, each chemical and/or rinse step may be individually optimized for a particular application. Optimization allows for the reduction of resource usage (i.e., chemicals and energy), an increase in throughput, and a reduction in defect counts.

The inventive SALSA clean recipe should not be restricted to the exact embodiments described herein. By way of example, the process may be implemented using different types of cleaning apparati than those mentioned herein, or additional SPM/APM cycles may be added. HCl rinse may be used in addition to, or instead of, DI rinse. The scope of the invention should be construed in view of the claims.

With this in mind, we claim:

1. A process for cleaning the surface of a silicon wafer consisting of the sequential steps of:
   (a) providing a silicon wafer having a surface;
   (b)(i) exposing said silicon wafer surface to a Sulfuric Peroxide Mixture (SPM) having a first chemical composition, then immediately thereafter and without any intervening drying step,
   (ii) rinsing said SPM from said silicon wafer surface with De-Ionized (DI) water;
   said steps (b)(i) and (b)(ii) being performed at least one time; then immediately thereafter and without any intervening drying step,
   (c)(i) exposing said silicon wafer surface to an Ammonium Peroxide Mixture (APM) having a second chemical composition, then immediately thereafter and without any intervening drying step,
    (ii) rinsing said APM from said silicon wafer surface with DI water;

(d) repeating steps (b)–(c) at least one time; and (e) drying said silicon wafer surface.

2. The process of claim 1, additionally including the step of:

installing said silicon wafer in a spray cleaning processor, said spray cleaning processor including means for spraying said silicon wafer at spray rates with a plurality of liquids, said spray cleaning processor additionally including means for providing nitrogen drying of said silicon wafer surface;

wherein said steps of exposing said silicon wafer surface to said SPM and to said APM comprise spraying said first chemical composition of said SPM onto said silicon wafer surface at a first spray rate for a first spraying time; and spraying said second chemical composition of said APM onto said silicon wafer surface at a second spray rate for a second spraying time; and wherein said step of drying said silicon wafer surface comprises said nitrogen drying.

3. The process of claim 2, wherein:

said silicon wafer is held in a rotatable cassette in said spray cleaning processor, said rotatable cassette having an adjustable rotation rate;

said spray cleaning processor including means for programmably adjusting said first chemical composition of said SPM and said second chemical composition of said APM to be sprayed onto said silicon wafer and said spray cleaning processor further including means for adjusting said spray rates of said SPM and said APM; and farther including the steps of:

adjusting said rotation rate of said rotatable cassette and said first chemical composition of said SPM and said second chemical composition of said APM and said first and second spraying times and said first and second spray rates to minimize residual particle contamination on said silicon wafer surface after completion of said wafer cleaning.

4. The process of claim 3, wherein:

said first chemical composition of said SPM is a volume ratio in the range between 1 and 4 parts sulfuric acid/1 part hydrogen peroxide;

said second chemical composition of said APM is a volume ratio in the range between 0.25 and 4 parts ammonium hydroxide/1 part hydrogen peroxide, mixed with 5–20 parts DI water;

said first spraying time is in the range between 5 and 15 minutes;

said second spraying time is in the range between 1 and 10 minutes;

said first spray rate is in the range between 1 and 3 liters/minute; and said second spray rate is in the range between 1 and 3 liters/minute.

5. The process of claim 4, wherein:

said first chemical composition of said SPM is a volume ratio of 2 parts sulfuric acid/1 part hydrogen peroxide;

said second chemical composition of said APM is a volume ratio of 1 part ammonium hydroxide/1 part hydrogen peroxide, mixed with 5 parts de-ionized (DI) water;

said first spraying time is 5 minutes;

said second spraying time is 3 minutes;

said first spray rate is 1 liter/minute; and said second spray rate is 1.7 liters/minute.

6. The process of claim 5, wherein said steps of (b)(i) exposing said silicon wafer surface to said Sulfuric Peroxide Mixture (SPM) and (b)(ii) rinsing said SPM from said silicon wafer surface is performed twice in succession before exposing said silicon wafer surface to said APM.

* * * * *